(12) United States Patent
Tsuchiya et al.

(10) Patent No.: US 9,543,344 B2
(45) Date of Patent: *Jan. 10, 2017

(54) IMAGING APPARATUS

(71) Applicant: SEIKO EPSON CORPORATION, Tokyo (JP)

(72) Inventors: Hitoshi Tsuchiya, Nagano (JP); Tsukasa Eguchi, Nagano (JP); Hideto Ishiguro, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/797,513

(22) Filed: Jul. 13, 2015

(65) Prior Publication Data
US 2015/0325615 A1 Nov. 12, 2015

Related U.S. Application Data

(63) Continuation of application No. 14/035,377, filed on Sep. 24, 2013, now Pat. No. 9,111,831.

(30) Foreign Application Priority Data

Sep. 26, 2012 (JP) ................................. 2012-211940

(51) Int. Cl.
H01L 27/146 (2006.01)
H01L 27/32 (2006.01)

(52) U.S. Cl.
CPC ..... *H01L 27/14627* (2013.01); *H01L 27/3234* (2013.01)

(58) Field of Classification Search
CPC ....................... H01L 27/3234; H01L 27/14627
See application file for complete search history.

(56) References Cited

U.S. PATENT DOCUMENTS

| 8,036,533 | B2 * | 10/2011 | Hosomi | G02B 6/4215 |
| | | | | 398/79 |
| 8,722,449 | B2 * | 5/2014 | Wada | H01L 27/14618 |
| | | | | 257/E31.127 |
| 2008/0205711 | A1 * | 8/2008 | Kishigami | G06K 9/0004 |
| | | | | 382/115 |

* cited by examiner

*Primary Examiner* — William Coleman
(74) *Attorney, Agent, or Firm* — Global IP Counselors, LLP

(57) ABSTRACT

An imaging apparatus includes a light emitting element layer, an optically transmissive first substrate and a light receiving element. The light emitting element layer faces a plurality of lenses. The optically transmissive first substrate includes a first surface with the light emitting element layer being disposed on the first surface. The light receiving element is arranged on an opposite side to the light emitting element layer so as to interpose the first substrate.

5 Claims, 5 Drawing Sheets

ID="1" /># IMAGING APPARATUS

CROSS-REFERENCE TO RELATED APPLICATIONS

This is a continuation application of U.S. patent application Ser. No. 14/035,377 filed on Sep. 24, 2013. This application claims priority to Japanese Patent Application No. 2012-211940 filed on Sep. 26, 2012. The entire disclosures of U.S. patent application Ser. No. 14/035,377 and Japanese Patent Application No. 2012-211940 are hereby incorporated herein by reference.

BACKGROUND

Technical Field

The present invention relates to an imaging apparatus which images a subject.

Background Technology

In the past, various technologies have been proposed where an image of veins in a living body is imaged for biometric authentication. For example, Patent Document 1 discloses a finger authentication apparatus where a light source section and an imaging section are arranged so as to face each other interposing a subject (a finger of the person to be authenticated) and light which has been emitted from the light source section and passed through a subject is imaged by the imaging section.

There is a problem in the technology of Patent Document 1 in that it is difficult to reduce the size of the apparatus since it is necessary to arrange the light source section and the imaging section so as to face each other interposing a subject. From the point of view of solving the problem described above, for example, Patent Document 2 discloses an imaging apparatus with a structure where a light source layer and a detection layer are laminated on a surface of a substrate. Light which has been emitted from the light source layer and passed through a subject is detected by each light receiving element in the detection layer. A light blocking layer which prevents direct irradiation from the light source layer with regard to the detection layer is arranged between the light source layer and the detection layer.

Japanese Laid-open Patent Publication No. 2003-30632 (Patent Document 1) and Japanese Laid-open Patent Publication No. 2009-3821 (Patent Document 2) are examples of the related art.

SUMMARY

However, there is a problem in the technology in Patent Document 2 in that it is difficult to maintain a sufficient amount of light which is incident from the subject to each light receiving element. Considering the situation described above, the invention has the advantage of maintaining a sufficient amount of light which reaches from a subject to light receiving elements.

In order to solve the problem described above, an imaging apparatus of the invention is provided with an optically transmissive first substrate (for example a substrate 32) which includes a first surface (for example, a surface 321), a plurality of lenses which oppose the first surface and focus incident light from the opposite side to the first substrate, a light emitting layer on a surface of the first surface, and a plurality of light receiving elements which are arranged on the opposite side to the plurality of lenses so as to interpose the first substrate. It is possible to maintain a sufficient amount of light which reaches from a subject to the light receiving elements compared with the technique in Patent Document 2 where there is no lens which focuses incident light from the subject since incident light from the subject which has been illuminated by light emitted from the light emitting layer reaches each of the light receiving elements after being focused by the plurality of lenses. Here, the "plurality of lenses" in the invention are a portion or all of the lenses which are provided in the imaging apparatus (for example, lenses other than dummy lenses which do not contribute to light focusing). In a similar manner, the "plurality of light receiving elements" in the invention are a portion or all of the light receiving elements which are provided in the imaging apparatus (for example, light receiving elements other than dummy light receiving elements which do not contribute to imaging).

An imaging apparatus according to one aspect includes a light emitting element layer, an optically transmissive first substrate and a light receiving element. The light emitting element layer faces a plurality of lenses. The optically transmissive first substrate includes a first surface with the light emitting element layer being disposed on the first surface. The light receiving element is arranged on an opposite side to the light emitting element layer so as to interpose the first substrate.

BRIEF DESCRIPTION OF THE DRAWINGS

Referring now to the attached drawings which form a part of this original disclosure.

DETAILED DESCRIPTION OF EXEMPLARY EMBODIMENTS

First Embodiment

Figure 1:
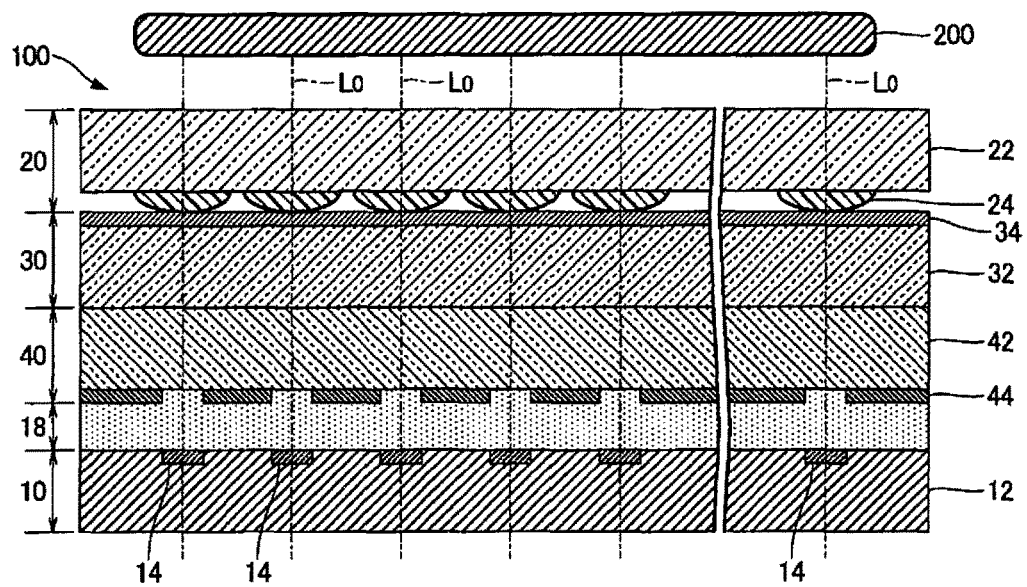
FIG. 1 is a cross sectional diagram of an imaging apparatus according to a first embodiment of the invention.
Figure 2:
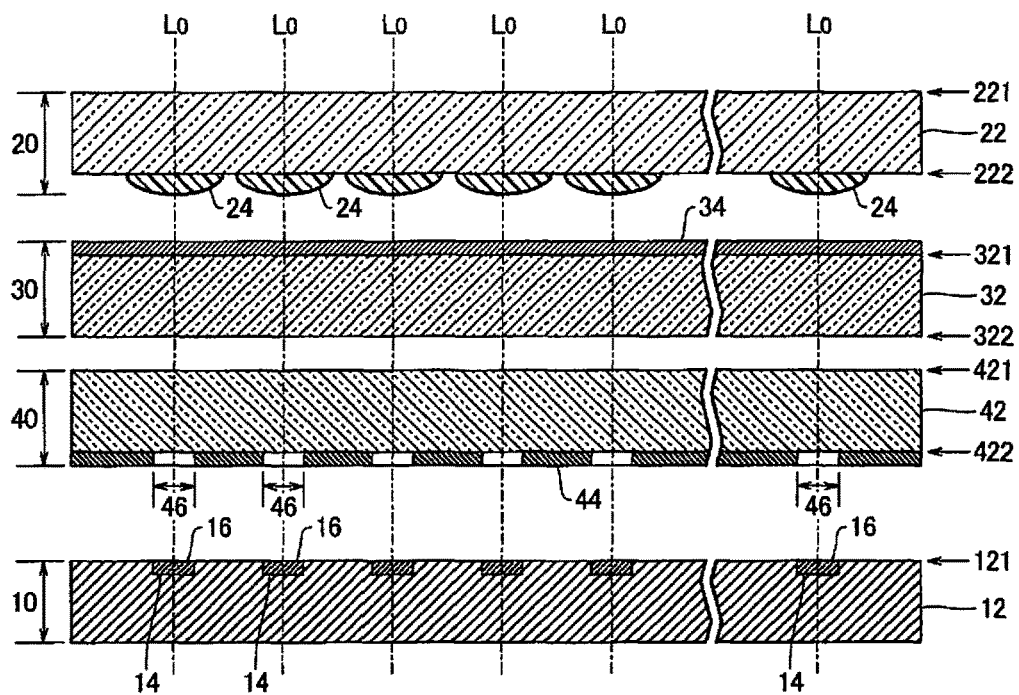
FIG. 2 is an exploded cross sectional diagram of the imaging apparatus.

FIG. 1 is a cross sectional diagram of an imaging apparatus 100 according to a first embodiment of the invention. FIG. 2 is an exploded cross sectional diagram of the imaging apparatus 100. The imaging apparatus 100 of the first embodiment is a sensing apparatus which images a subject 200 in a state in which illumination light with a specific wavelength (referred to below as "imaging light") is irradiated, and for example, is preferably used as a biometric authentication apparatus (vein sensor) which images an image of veins in a living body (typically, a human finger). The imaging light is, for example, near infrared light. As shown in FIG. 1 and FIG. 2 the imaging apparatus 100 of the first embodiment is provided with a light receiving section 10, a light focusing section 20, a light emitting section 30, and a light blocking section 40.

The light emitting section 30 is interposed between the light receiving section 10 and the subject 200. The light focusing section 20 is interposed between the light emitting section 30 and the subject 200, and the light blocking section 40 is interposed between the light emitting section 30 and the light receiving section 10. Schematically, incident light from the subject 200 which is illuminated by the imaging light which is output from the light emitting section 30 reaches the light receiving section 10 after having been focused by the light focusing section 20.

Figure 3:
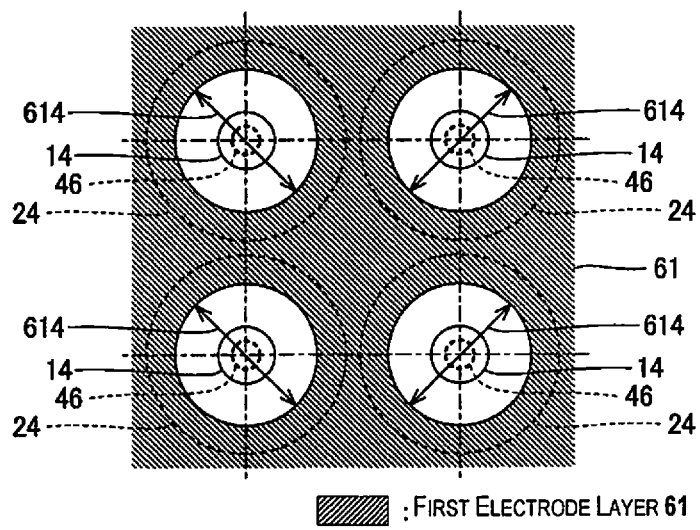
FIG. 3 is a planar diagram illustrating a relationship between each element of the imaging apparatus.

The light receiving section 10 is an element which images the subject 200 and is configured to include a substrate 12 and a plurality of light receiving elements 14. The substrate 12 is a member with a plate shape which is formed from, for example, a semiconductor material. The plurality of light receiving elements 14 are formed on a surface 121 on the subject 200 side of the substrate 12, and are ordered in a matrix formation in a planar view (that is, when viewed from a direction which is perpendicular to the substrate 12) as shown in FIG. 3. Each of the plurality of light receiving elements 14 generate a detection signal according to the amount of imaging light which is incident onto a light receiving surface 16 with a substantially cylindrical shape. An image of the subject 200 is generated by the detection signal which the plurality of light receiving elements 14 generate being image processed. For example, a CMOS (Complementary Metal Oxide Semiconductor) sensor or a CCD (Charge Coupled Device) sensor which is well known is preferably used as the light receiving section 10.

The light focusing section 20 in FIG. 1 is an element which focuses imaging light which arrives from the subject 200 and is configured to include a substrate 22 and a plurality of lenses (microlenses) 24. As shown in FIG. 2, the substrate 22 is an optically transmissive (a property whereby it is possible for imaging light to pass through) member with a plate shape which includes a surface 221 which opposes the subject 200 and a surface 222 on the opposite side to the surface 221. For example, a glass substrate or a quartz substrate is preferably adopted as the substrate 22. The plurality of lenses 24 are formed on the surface 222 of the substrate 22. Each of the lenses 24 is a convex lens which focuses imaging light which is incident from the subject 200 onto the surface 221 of the substrate 22. Each of the lenses 24 in the light focusing section 20 and each of the light receiving elements 14 in the light receiving section 10 correspond one to one. In detail, an optical axis L0 of each of the lenses 24 passes through the light receiving surface 16 (typically, the center of the light receiving surface 16) of the light receiving elements 14 which correspond to each of the lenses 24. Accordingly, as shown in FIG. 3, the plurality of lenses 24 are ordered in a matrix formation in a planar view in a similar manner to each of the light receiving elements 14. For example, an arbitrary manufacturing technique of such as a method (reflow method) where each of the lenses 24 is formed by heat deforming numerous fine resists which are formed on the substrate 22, a method where each of the lenses 24 is formed by a photolithography process which uses an area gradation mask, a method where the substrate 22 and each of the lenses 24 are integrally formed by polishing and molding a member with a plate shape, or the like is adopted in the manufacturing of each of the lenses 24.

The light emitting section 30 in FIG. 1 is an element which generates imaging light and is configured to include a substrate 32 and a light emitting element layer 34. As shown in FIG. 2, the substrate 32 is an optically transmissive member with a plate shape (for example, a glass substrate or a quartz substrate) which includes a surface 321 which opposes the light focusing section 20 (each of the lenses 24) and a surface 322 on the opposite side to the surface 321. The light emitting element layer 34 is formed on the surface 321 of the substrate 32 and functions as the light source of the imaging light which illuminates the subject 200.

Figure 4:
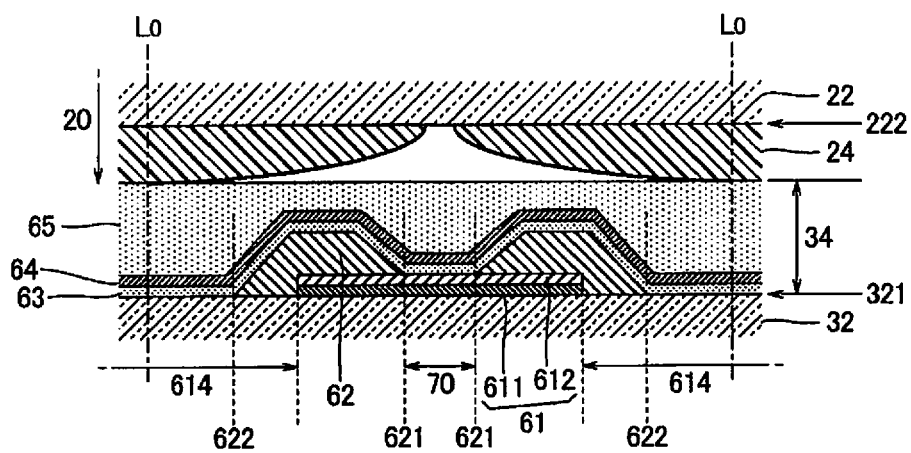
FIG. 4 is a cross sectional diagram where a light emitting element layer is enlarged.

FIG. 4 is a cross sectional diagram where the light emitting element layer 34 is enlarged. As shown in FIG. 4, the light emitting element layer 34 is configured to include a first electrode layer 61, an insulating layer 62, a light emitting layer 63, a second electrode layer 64, and a sealing layer 65. The light emitting layer 63 is an electro-optical layer which outputs imaging light using supply of an electric current and is formed from, for example, an organic EL (Electroluminescence) material.

The first electrode layer 61 is formed on the surface 321 of the substrate 32 and functions as an electrode (an anode) which is electrically connected to the light emitting layer 63. As shown in FIG. 4, the first electrode layer 61 has a structure where a first layer 611 and a second layer 612 are laminated. The first layer 611 is a conductive film with a light reflecting property which reflects the imaging light, which is generated by the light emitting layer 63, to the subject 200 side and is formed on the surface 321 of the substrate 32 using, for example, a conductive material such as silver or aluminum. On the other hand, the second layer 612 is an optically transmissive conductive film which imaging light passes through and is formed using, for example, an optically transmissive conductive material such as ITO (Indium Tin Oxide) and covers the first layer 611.

As shown in FIG. 3, a plurality of opening sections 614 are formed in the first electrode layer 61 with a circular shape in a planar view. Each of the opening sections 614 in the first electrode layer 61 and each of the lenses 24 in the light focusing section 20 (or each of the light receiving elements 14 in the light receiving section 10) correspond one to one. In detail, the optical axis L0 of each of the lenses 24 passes through the opening sections 614 (typically, the center of the opening sections 614) which correspond to the lenses 24. Accordingly, as shown in FIG. 3, each of the opening sections 614 is ordered in a matrix formation in a planar view in a similar manner to each of the lenses 24 or each of the light receiving elements 14. That is, the first electrode layer 61 is formed in a substantially grid formation where the plurality of opening section 614 are ordered in a matrix formation in a planar view. The inner diameter of each of the opening sections 614 is smaller than the outer diameter of each of the lenses 24. As is understood from the above description, the first electrode 61 (the first layer 611) functions as an opening regulating layer which regulates the opening sections 614 where imaging light which is focused by each of the lenses 24 in the light focusing section 20 passes through to the light receiving section 10 side. The imaging light which is generated by the light emitting layer 63 progresses not only to the subject 200 side but also progresses to the light receiving section 10 side, but the imaging light which progresses from the light emitting layer 63 to the light receiving section 10 side is reflected to the subject 200 side by the first electrode layer 61. That is, it can also be said that the opening regulating layer (the first electrode layer 61) is a light blocking layer where direct irradiation of the imaging light (that is, irradiation of the imaging light which does not come from the subject 200) from the light emitting layer 63 is prevented with regard to the light receiving section 10. For example, an arbitrary manufacturing technique which is well known such as a photolithography process is adopted in forming of the opening sections 614 (the selective removal of the conductive film).

The insulating layer 62 in FIG. 4 is formed using an optically transmissive insulating material (for example, a resin material). The light emitting layer 63 is continuous using a substantially uniform film thickness across the entire region of the surface 321 where the insulating film 62 is formed. Here, it is possible to form a charge injection layer (a positive hole injection layer and an electron injection layer) and a charge transport layer (a positive hole transport layer and an electron transport layer) along with the light emitting layer 63 in order to improve the light emitting efficiency of the light emitting layer 63.

The second electrode layer 64 is formed continuously across the entire region of the surface 321 so as to cover the light emitting layer 63, is electrically connected to the light emitting layer 63, and functions as an electrode (cathode) which supplies an electric current to the light emitting layer 63 between the first electrode layer 61 and the second electrode layer 64. The second electrode layer 64 is a semi-transmissive reflective conductive film which transmits a portion of incident light and reflects the other portion of incident light. Accordingly, a resonator structure, which selectively amplifies imaging light with a specific wavelength (a near-infrared region) and outputs the imaging light to the subject 200 side, is formed between the first electrode layer 61 the second electrode layer 64. The second electrode layer 64 is formed by forming a film with an extremely thin film thickness with, for example, an insulating material such as silver or aluminum. Here, the second electrode 64 can adopt the configuration of an optically transmissive insulating film (a configuration where the resonator structure is not formed).

The sealing layer 65 is an element which seals each of the elements of the light emitting element layer 34 described above (the first electrode 61, the insulating layer 62, the light emitting layer 63, and the second electrode layer 64) to protect each of the elements from air and moisture, and is formed from an optically transmissive insulation material (for example, a resin material). The light focusing section 20 and the light emitting section 30 are fixed to each other by, for example, an optically transmissive adhesive (which is not shown in the diagram). In FIG. 1 and FIG. 4, a configuration is exemplified where the light focusing section 20 and the light emitting section 30 are bonded so that a surface of the light emitting element layer 34 (the sealing layer 65) in the light emitting section 30 and a surface of each of the lenses 24 in the light focusing section 20 come into contact. Here, it is possible to fix the light focusing section 20 and the light emitting section 30 to each other so that a surface of the light emitting element layer 34 and a surface of each of the lenses 24 oppose each other with a gap.

As shown in FIG. 4, a region where the insulating layer 62 is not interposed between the first electrode layer 61 and the second electrode layer 64 out of a region where the first electrode layer 61 and the second electrode layer 64 oppose each other functions as a light emitting region 70 where the light emitting layer 63 emits light by an electric current being supplied between the first electrode layer 61 and the second electrode layer 64. On the other hand, in a region where the insulating layer 62 is interposed between the first electrode layer 61 and the second electrode layer 64 out of a region where the first electrode layer 61 and the second electrode layer 64 oppose each other, the light emitting layer 63 does not emit light since the electric current between the first electrode layer 61 and the second electrode layer 64 is impeded by the insulating layer 62. That is, the insulating layer 62 functions as an element which regulates the light emitting region 70 which actually emits the imaging light from the light emitting layer 63. Here, the light emitting layer 63 is also formed in a region at the inner side of each opening section 614 but the light emitting layer 63 does not emit light since the first electrode 61 does not exist at the inner side of each of the opening sections 614.

Figure 5:
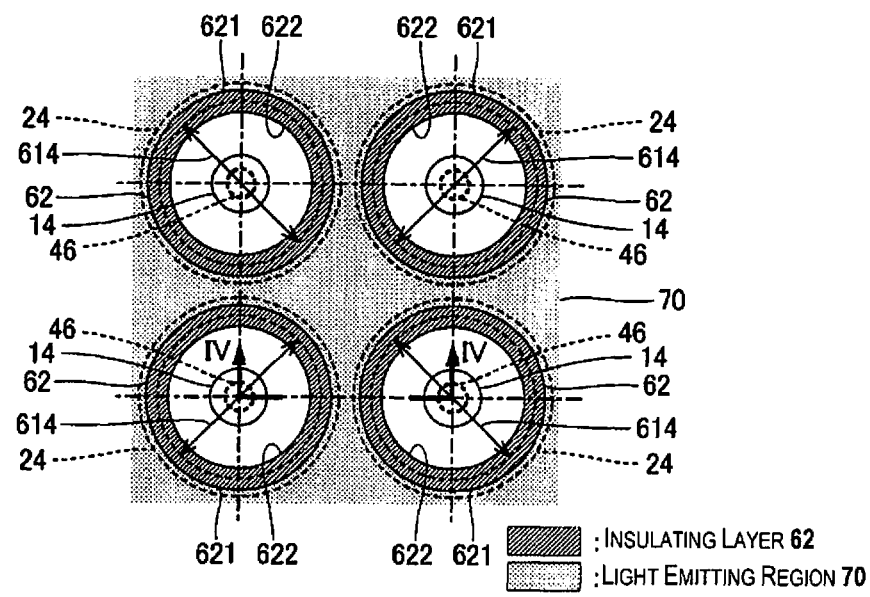
FIG. 5 is a planar diagram illustrating a relationship between an insulating layer and a light emitting region.

FIG. 5 is a schematic diagram where the insulating layer 62 has a planar form. The cross sectional diagram along the line IV-IV in FIG. 5 is equivalent to FIG. 4. As shown in FIG. 5, the insulating layer 62 corresponds one to one with each of the lenses 24 in the light focusing section 20 (or each of the light receiving elements 14 in the light receiving section 10 or each in the opening sections 614 of the first electrode layer 61). In detail, as is understood from FIG. 4 and FIG. 5, the insulating layer 62 is formed with a circular shape which is covered by the peripheral edge (inner peripheral edge) of each of the opening sections 614 in the first electrode layer 61. That is, an outer peripheral edge 621 of the insulating layer 62 is positioned on the outer side (the opposite side to the optical axis L0 of each of the lenses 24) of the peripheral edge of the opening sections 614 and an inner peripheral edge 622 of the insulating layer 62 is positioned on the inner side (the optical axis L0 side of each of the lenses 24) of the peripheral edge of the opening sections 614. As shown in FIG. 5, a region which is positioned on the outer side (the opposite side to the optical axis L0 of the lens 24) of the outer peripheral edge 621 of the insulating layer 62 in a planar view is specified as the light emitting region 70. That is, the light emitting region 70 in the first embodiment is specified in substantially a grid formation which corresponds to regions in gaps between each of the plurality of lenses 24 which are ordered in a matrix formation in a planar view.

The light blocking section 40 in FIG. 1 and FIG. 2 is an element which blocks stray light which is light other than the imaging light which is focused by each of the lenses 24 in the light focusing section 20 and is configured to include a substrate 42 and a light blocking layer 44. As shown in FIG. 2, the substrate 42 is an optically transmissive member with a plate shape (for example, a glass substrate or a quartz substrate) which includes a surface 421 which opposes the light emitting section 30 and a surface 422 on the opposite side to the surface 421. The light blocking layer 44 is a film body with a light blocking property (a property whereby the imaging light is absorbed or reflected) which is formed on the surface 422 of the substrate 42. For example, the light blocking layer 44 is formed using a resin material where a black additive (a black pigment) such as carbon black is dispersed or a metallic material with a light blocking property such as chrome. A material with a low rate of reflectivity is preferred as the material of the light blocking layer 44 from the point of view of preventing the occurrence of stray light due to reflecting off the surface of the light blocking layer 44.

As shown in FIG. 2 and FIG. 3, a plurality of opening sections 46 with circular shapes are formed in the light blocking layer 44. The inner diameter of the opening sections 46 are less than the inner diameter of the opening sections 614 in the first electrode layer 61. Each of the opening sections 46 in the light blocking layer 44 and each of the lenses 24 in the light focusing section 20 (or each of the light receiving elements 14 in the light receiving section 20 or each of the opening sections 614 in the first electrode layer 61) correspond one to one. In detail, the optical axis L0 of each of the lenses 24 pass through the opening sections 46 (typically, the center of the opening sections 46) which correspond to each of the lenses 24. Accordingly, as shown in FIG. 3, each of the opening sections 46 are ordered in a matrix formation in a planar view in the same manner as each of the lenses 24 and each of the light receiving elements 14.

As shown in FIG. 1 and FIG. 2, the surface 421 of the substrate 42 where the light blocking layer 44 is formed on the surface 422 and the surface 322 of the substrate 32 where the light emitting element layer 34 is formed on the surface 321 are bonded in a state of being closely adhered to each other. For example, an optically transmissive adhesive agent (which is not shown in the diagram) is used in the bonding of the substrate 42 and the substrate 32. In addition, the surface 422 of the substrate 42 where the light blocking layer 44 is formed and the surface 121 of the substrate 12 in the light receiving section 10 are bonded to each other with a gap using, for example, an optically transmissive adhesive agent 18. As is understood from the above description, the light blocking layer 44 is arranged between the substrate 32 in the light emitting section 30 and the plurality of light receiving elements 14 in the light receiving section 10.

In the configuration described above, the imaging light which is output from the light emitting region 70 in the light emitting section 30 passes through the light focusing section 20 (the substrate 22 and each of the lenses 24) and irradiates the subject 200, passes through or is reflected by veins inside the subject 200 and is incident on the light focusing section 20, and passes through the opening sections 614 in the first electrode layer 61 and the opening sections 64 in the light blocking layer 44 after having been focused by each of the lenses 24 and reaches the light receiving surface 16 of the light receiving element 14. Accordingly, an image of veins in the subject 200 is imaged.

As described above, since the light emitting section 30 (the light emitting layer 63) is arranged between each of the light receiving elements 14 in the light receiving section 10 and the subject 200 in the first embodiment, it is easy to reduce the size of the apparatus in comparison to the technique in Patent Document 1 where a light source section and an imaging section are arranged so as to oppose each other interposing the subject. In addition, since the light emitting region 70 which irradiates imaging light onto the subject 200 is distributed in a planar form in the first embodiment, it is possible to reduce uneven distribution of the amount of irradiating light with regard to the subject 200 (to uniformly illuminate the subject 200) in comparison to a case where a point light source such as an LED (Light Emitting Diode) being used to illuminate the subject 200. Moreover, since the imaging light from the subject 200 which is illuminated by the light emitting section 30 reaches the light receiving element 14 after having been focused by each of the lenses 24 in the light focusing section 20 in the first embodiment, there is an advantage in that it is possible to secure a sufficient amount of light which reaches from the subject 200 to each of the light receiving elements 14 in comparison to the technique in Patent Document 2 where there is no element which focuses the imaging light.

In addition, since the first electrode layer 61 with the light blocking property (light reflecting property) where the opening sections 614 which correspond to each of the lenses 24 are formed is arranged between the surface 321 of the substrate 32 and the light emitting layer 63 (the light emitting region 70) in the first embodiment, direct irradiation of the imaging light from the light emitting layer 63 is suppressed with regard to each of the light emitting elements 14. Accordingly, there is an advantage in that it is possible to acquire an excellent image of the subject 200 with high contrast. In particular, the first electrode layer 61 which supplies a current to the light emitting layer 63 is also used as the opening regulating layer (the light blocking layer) which prevents direct irradiation of the imaging light with regard to each of the light receiving elements 14 in the first embodiment, there is an advantage in that the configuration and the manufacturing process of the imaging apparatus 100 are simplified in comparison to a case where the first electrode layer 61 and the opening regulating layer are individually formed. However, it is possible to form the first electrode layer 61 and the opening regulating layer individually.

In addition, since the light blocking layer 44 where the opening sections 46 which correspond to each of the lenses 24 are formed is arranged between the light focusing section 20 and the light receiving section 10 in the first embodiment, it is possible to prevent a situation (optical crosstalk) where the imaging light which has passed through another of the lenses 24 reaches the light receiving element 14 which corresponds to each of the lenses 24 in the light focusing section 20. Accordingly, there is an advantage in that it is possible to acquire an excellent image of the subject 200 with high contrast.

Second Embodiment

A second embodiment of the invention will be described below. Here, the reference numerals which were referenced in the description of the first embodiment will be used with regard to the elements where the operation and functions are the same as the first embodiment in each format which is exemplified below and the detailed description thereof will be appropriately omitted.

In the configuration in the first embodiment, there is a possibility that the imaging light, which is output from the light emitting region 70 of the light emitting layer 63 and progresses to the subject 200 side, is reflected by the surface of each of the lenses 24 before reaching the subject 200 and reaches the light receiving element 14 by passing through the opening section 614 and the opening section 46 (this phenomenon is referred to below as "directly received light of the lens reflected light" for convenience). The second embodiment and a third embodiment which are exemplified below are formats where the light emitting region 70, where the directly received light of the lens reflected light is suppressed, is regulated with the assumption that the configuration is the same as the first embodiment.

Figure 6:
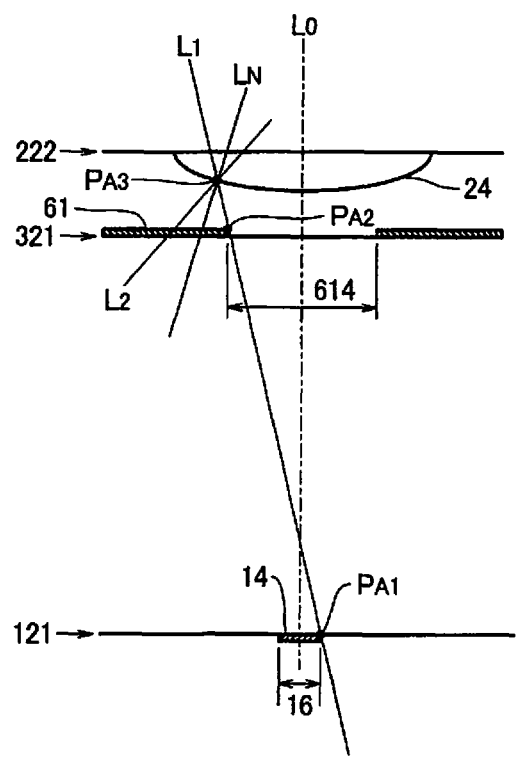
FIG. 6 is an explanatory diagram of a first straight line and a second straight line in a second embodiment.

FIG. 6 is a schematic diagram illustrating a positional relationship, in a plane (referred to below as a "reference plane") which includes the optical axis L0 of one arbitrary lens (referred to below as a "specific lens") 24 in the light focusing section 20, between the light receiving element 14, the first electrode layer 61, and the specific lens 24. As shown in FIG. 6, the first straight line L1 and the second straight line L2 are regulated in the reference plane in the second embodiment.

The first straight line L1 is a straight line which passes through the point PA1 and the point PA2 in the reference plane. The point PA1 is a spot (an intersection point of the peripheral edge of the light receiving surface 16 and the reference plane) which is in the reference plane and corresponds to the peripheral edge on one side (the right side of the optical axis L0 in FIG. 6) when viewed from the optical axis L0 of the specific lens 24 on the light receiving surface 16 of the light receiving element 14 which corresponds to the specific lens 24. On the other hand, the point PA2 is a spot (an intersection point of the inner peripheral edge of the opening section 614 and the reference plane) which is in the reference plane and corresponds to the inner peripheral edge on the other side (the left side of the optical axis L0 in FIG. 6) when viewed from the optical axis L0 of the specific lens 24 in the opening section 614 of the first electrode layer 61 which corresponds to the specific lens 24. As above, since the point PA1 and the point PA2 are positioned on the opposite sides interposing the optical axis L0 of the specific lens 24, the straight line L1 intersects with the optical axis L0 of the specific lens 24 between the point PA1 and the point PA2.

A straight line (that is, a normal line on the surface of the specific lens 24 at the point PA3) LN is assumed to be in the reference plane, to pass through the point PA3 where the first straight line L1 and the surface of the specific lens 24 intersect, and to be perpendicular to a tangent at the point PA3 with regard to the surface of the specific lens 24. The second straight line L2 is a straight line which has a relationship of being line symmetrical with the first straight line L1 with the normal line LN as the axis of symmetry. That is, a bisecting line with an angle which is formed by the first straight line L1 and the second straight line L2 is equivalent to the normal line LN.

Figure 7:
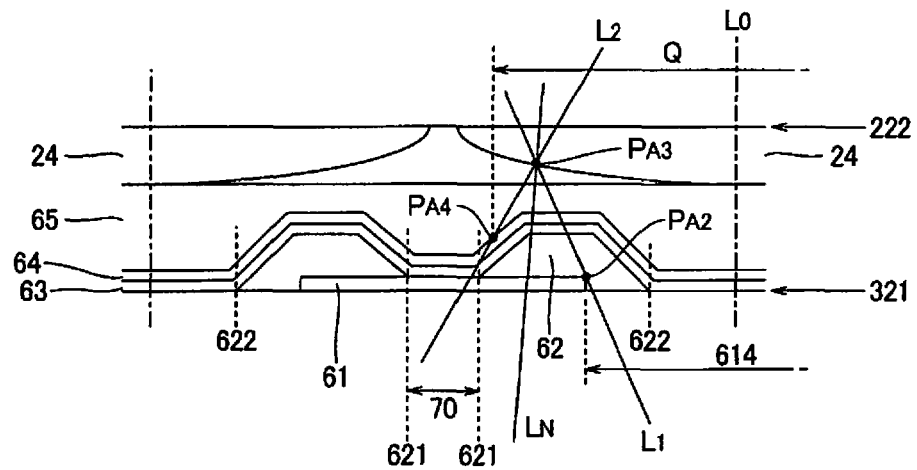
FIG. 7 is a cross sectional diagram of a light emitting layer in the second embodiment.

FIG. 7 is a cross sectional diagram where the light receiving element layer 34 is enlarged in the same manner as FIG. 4. Here, hatching is omitted in FIG. 7 for convenience from the point of view of preventing complication of the diagram. As shown in FIG. 7, an intersection point PA4 of the second straight line L2 which is regulated by the conditions above and the surface of the second electrode layer 64 in the light emitting section 30 (or the light emitting layer 63 or the surface of the first electrode layer 61) is regulated in the reference plane. The path which is regulated by the second straight line L2 and the first straight line L1 is equivalent to an optical path which is the boundary of whether or not the imaging light, which is output from the light emitting region 70 and reflected by the surface of the specific lens 24, reaches into the light receiving surface 16 of the light receiving element 14. That is, there is a possibility that the imaging light, which is output from the inner side of the intersection point PA4 (the optical axis L0 side of the specific lens 24) and reflected by the surface of the specific lens 24, reaches the light receiving surface 16 of the light receiving element 14 by passing through the opening section 614 of the first electrode layer 61. On the other hand, the imaging light, which is output from the outer side of the intersection point PA4 (the opposite side to the optical axis L0 of the specific lens 24) and reflected by the surface of the specific lens 24, does not reach the light receiving surface 16 of the light receiving element 14 due to being blocked by the first electrode layer 61 or reaching a region in the surface 12 on the outer side of the light receiving surface 16. That is, the light of the lens reflected light is prevented from being directly received. In consideration of the above tendency, the light emitting region 70 is specified in the second embodiment so as to be positioned on the opposite side to the optical axis L0 of the specific lens 24 when viewed from the intersection point PA4. In detail, the dimensions and the shape of the insulating layer 62 are selected so that the light emitting region 70 is positioned on the opposite side to the optical axis L0 of the specific lens 24 when viewed from the intersection point PA4.

Figure 8:
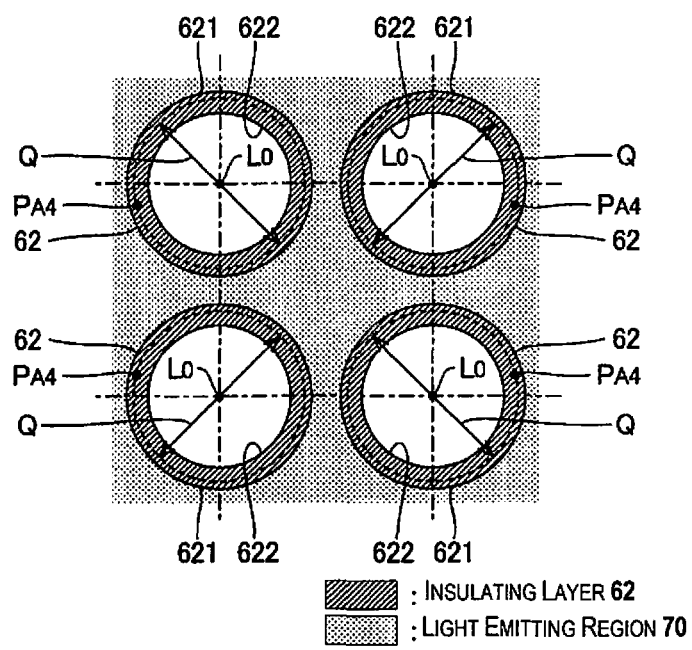
FIG. 8 is a planar diagram illustrating a relationship between an insulating layer and a light emitting region in the second embodiment.

FIG. 8 is an explanatory diagram where the light emitting region 70 has a planar form. Regions Q are illustrated in FIG. 8 as specified by the trajectory of the intersection point PA4 in each of the reference planes when the reference plane is rotated with the optical axis L0 of the specific lens 24 as a rotation axis as shown in FIG. 8. The regions Q are specified for each of the lenses 24 in the light focusing section 20 and are ordered in a matrix formation in a planar view so as to correspond to each of the lenses 24. The light emitting region 70 is specified into regions with substantially a grid formation which excludes each of the regions Q in the surface 321 of the substrate 32. That is, the light emitting region 70 and each of the regions Q do not overlap with each other in a planar view. It is possible to also state that the outer peripheral edges 621 of the insulating layer 62 with a circular shape which corresponds to each of the lenses 24 are positioned at the outer side of the regions Q as shown in FIG. 8 since the planar form of the light emitting region 70 is regulated by the outer peripheral edges 621 of the insulating layer 62 as described above in the first embodiment.

The effects which are the same as the first embodiment are realized in the second embodiment. In addition, it is possible to suppress the light of the lens reflected light being directly received in the second embodiment due to the light emitting region 70 being positioned on the opposite side to the optical axis L0 of the specific lens 24 when viewed from the intersection point PA4 of the second straight line L2 and the surface of the second electrode layer 64.

Third Embodiment

Figure 9:
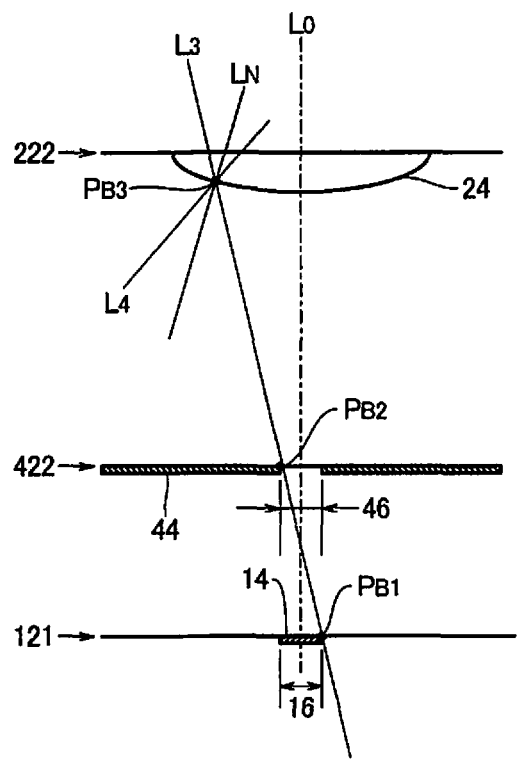
FIG. 9 is an explanatory diagram of a third straight line and a fourth straight line in a third embodiment.

FIG. 9 is a schematic diagram illustrating a positional relationship, in the reference plane which includes the optical axis L0 of one arbitrary lens (the specific lens) 24 in the light focusing section 20, between the light receiving element 14, the light blocking layer 44, and the specific lens 24. As shown in FIG. 9, the third straight line L3 and the fourth straight line L4 are regulated in the reference plane in the third embodiment.

The third straight line L3 is a straight line which passes through the point PB1 and the point PB2 in the reference plane. The point PB1 is a spot which corresponds to the peripheral edge on one side (the right side of the optical axis L0 in FIG. 9) when viewed from the optical axis L0 of the specific lens 24 in the light receiving surface 16 of the light receiving element 14 which corresponds to the specific lens 24 in the same manner as the point PA1 in the second embodiment. On the other hand, the point PA2 is a spot which is in the reference plane and corresponds to the inner peripheral edge on the other side (the left side of the optical axis L0 in FIG. 9) when viewed from the optical axis L0 of the specific lens 24 in the opening section 46 of the light blocking layer 44 which corresponds to the specific lens 24. Accordingly, the third straight line L3 intersects with the optical axis L0 of the specific lens 24 between the point PB1 and the point PB2. On the other hand, the fourth straight line L4 is a straight line which has a relationship of being line symmetrical with the third straight line L3 with the normal line LN as the axis of symmetry in the surface at the point PB3 where the third straight line L3 and the surface of the specific lens 24 intersect in the same manner as the second straight line L2 in the second embodiment.

Figure 10:
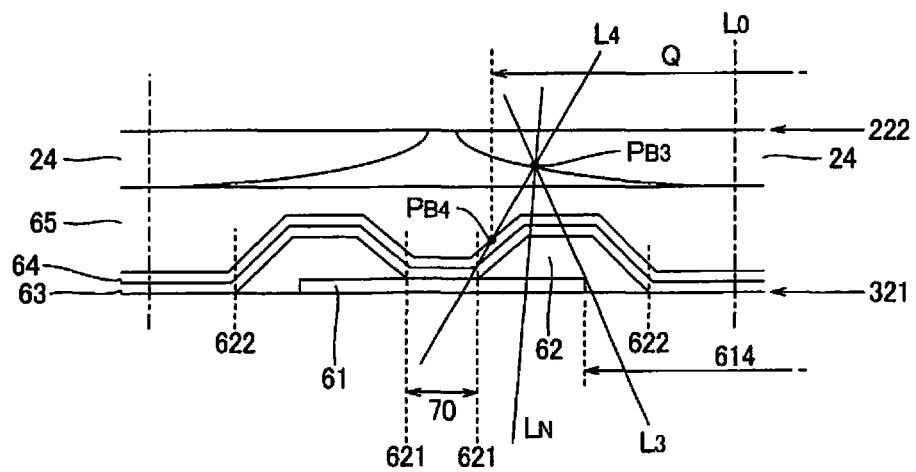
FIG. 10 is a cross sectional diagram of a light emitting element layer in the third embodiment.

FIG. 10 is a cross sectional diagram where the light receiving element layer 34 is enlarged in the same manner as FIG. 7. As shown in FIG. 10, an intersection point PB4 of the fourth straight line L4 which is regulated by the conditions above and the surface of the second electrode layer 64 in the light emitting section 30 is regulated in the reference plane. There is a possibility that the imaging light, which is output from the inner side of the intersection point PB4 (the optical axis L0 side of the specific lens 24) and reflected by the surface of the specific lens 24, reaches the light receiving surface 16 of the light receiving element 14 by passing through the opening section 64 of the light blocking layer 44. On the other hand, the imaging light, which is output from the outer side of the intersection point PB4 (the opposite side to the optical axis L0 of the specific lens 24) and reflected by the surface of the specific lens 24, does not reach the light receiving surface 16 of the light receiving element 14 due to being blocked by the light blocking layer 44 or reaching a region in the surface 12 on the outer side of the light receiving surface 16. In consideration of the above tendency, the dimensions and the shape of the insulating layer 62 are selected in the third embodiment so that the light emitting region 70 is positioned on the opposite side to the optical axis L0 of the specific lens 24 when viewed from the intersection point PB4. In addition, it can also be said that, when the regions Q which are equivalent to the trajectory of the intersection point PB4 are specified for each of the lenses 24 in the light focusing section 20 as shown in FIG. 8, the light emitting region 70 is specified into regions with substantially a grid formation which excludes each of the regions Q in the surface 321 of the substrate 32. That is, the outer peripheral edges 621 of the insulating layer 62 with a circular shape which corresponds to each of the lenses 24 are positioned at the outer side of the regions Q and the light emitting region 70 and each of the regions Q do not overlap with each other in a planar view.

The effects which are the same as the first embodiment are realized in the third embodiment. In addition, it is possible to suppress the light of the lens reflected light being directly received in the third embodiment in the same manner as the second embodiment due to the light emitting region 70 being positioned on the opposite side to the optical axis L0 of the specific lens 24 when viewed from the intersection point PB4 of the fourth straight line L4 and the surface of the second electrode layer 64.

Modified Examples

It is possible for each of the formats described above to be changed in various ways. Various aspects are exemplified in detail below. It is possible for two or more of the aspects which are arbitrarily selected from the exemplifications below to be appropriately combined.

(1) In each of the formats described above, the light emitting region 70 is specified by the insulating layer 62 being interposed between the first electrode layer 61 and the second electrode layer 64 in a configuration where the light emitting layer 63 is continuously distributed over the entire area of the substrate 32, but the configuration for specifying the light emitting region 70 is not limited to the exemplification above. For example, it is possible to form the light emitting layer 63 so that the planar form of the light emitting region 70 satisfies conditions which are exemplified by each of the formats described above. For example, it is possible to form the light emitting layer 63 in arbitrary shapes using a photolithography technique where a film body which is formed on the substrate 32 using an organic EL material is selectively removed or a printing technique (for example, a liquid droplet discharging technique) where an organic EL material is selectively coated onto a specific region of the substrate 32.

(2) In each of the formats described above, the substrate 32 of the light emitting section 30 and the substrate 42 of the light blocking section 40 are separate elements but it is possible for the substrate 32 and the substrate 42 to be a single substrate. That is, the light emitting element layer 34 is formed on the surface on one side of the single substrate and the light blocking layer 44 is formed on the other surface of the single substrate. Naturally, there is an advantage in that it is possible to execute a process where the light emitting element layer 34 is formed on the substrate 32 and a process where the light blocking layer 44 is formed on the substrate 42 separately from each other in a configuration where the substrate 32 of the light emitting section 30 and the substrate 42 of the light blocking section 40 are separate as in each of the formats described above.

(3) In each of the formats described above, the imaging apparatus 100 (a vein sensor) which images an image of veins for biological authorization is exemplified, but the purpose of the invention is arbitrary. For example, it is possible for the invention to be applied to an alcohol detection apparatus which estimates the concentration of alcohol in blood from the images of veins in a living body which is imaged by the imaging apparatus 100 or a blood sugar value estimation apparatus which estimates a blood sugar value from the images of veins in a body which is imaged by the imaging apparatus 100. In addition, it is possible to apply the invention to an image reading apparatus which reads an image from a printout. Here, visible light is preferably used as imaging light in a case where the invention is applied to the image reading apparatus.

The imaging apparatus according to the embodiment is provided with an opening regulating layer (for example, a first electrode layer 61) with a light blocking property which is arranged between the first surface and the light emitting layer and which has a plurality of first opening sections (for example, opening sections 614) through which passes light which is focused by the plurality of lenses. In the configuration described above, the possibility of emitted light from the light emitting layer directly reaching each of the light receiving elements is reduced since the opening regulating layer is interposed between the light emitting layer and each of the light receiving elements. In addition, according to a configuration where a first electrode layer which is electrically connected to the light emitting layer is applied as the opening regulating layer, there is an advantage in that the configuration of the apparatus and the production process is simplified compared with a case where the first electrode layer and the opening regulating layer are formed individually.

In a preferred example of the imaging apparatus which is provided with an opening regulating section, in a reference plane which includes an optical axis of one lens among the plurality of lenses, in a case of regulating a first straight line (for example, a first straight line L1) which passes through a peripheral edge (for example, a point PA1) on one side, when viewed from an optical axis, of a light receiving surface of the light receiving element which corresponds to the one lens and a peripheral edge (for example, a point PA2) on the other side, when viewed from an optical axis, of the first opening section which corresponds to the one lens in the opening regulating layer and a second straight line (for example, a second straight line L2) with line symmetry with the first straight line with a normal line of the surface, which is at an intersection point (for example, a point PA3) of the first straight line and the surface of the one lens, as the axis of symmetry, a light emitting region in the light emitting layer is positioned on the opposite side to the optical axis of the one lens when viewed from an intersection point (for example, an intersection point PA4) of the second straight line and a surface of a second electrode layer which covers the light emitting layer. According to the aspect described above, it is possible to reduce the possibility of light which is emitted from the light emitting layer and reflected by the surface of each of the lenses passing through the first opening section and reaching the light receiving elements.

The imaging apparatus according to the embodiment is provided with a light blocking layer which is arranged between the first substrate and the plurality of light receiving elements and has a plurality of second opening sections (for example, opening sections 46) which correspond to each of the lenses. In the configuration described above, it is possible to reduce the possibility of light which is emitted from the light emitting layer directly reaching each of the light receiving elements or the possibility of light which is focused by each of the lenses reaching the light receiving elements which correspond to lens other than the lens since the light blocking layer is interposed between the light emitting layer and each of the light receiving elements. In addition, a configuration is also preferable where an optically transmissive second substrate is arranged on the opposite side to the plurality of lenses so as to interpose the first substrate, and the light blocking layer is formed on the second substrate. According to the configuration described above, there is an advantage in that it is possible to execute a process of forming the light emitting layer on the first substrate and a process of forming the light blocking layer on the second substrate independently of each other. In detail, the second substrate is bonded to a second surface on the opposite side to the first surface of the first substrate, and the light blocking layer is arranged on the surface on the opposite side to the first substrate of the second substrate.

In a preferred example of the imaging apparatus which is provided with the light blocking layer, in a reference plane which includes an optical axis of one lens among the plurality of lenses, in a case of regulating a third straight line (for example, a third straight line L3) which passes through a peripheral edge (for example, a point PB1) on one side, when viewed from an optical axis, of a light receiving surface of the light receiving element which correspond to one lens and a peripheral edge (for example, a point PB2) of the other side, when viewed from an optical axis, of the second opening section which corresponds to the one lens in the light blocking layer and a fourth straight line (for example, a fourth straight line L4) with line symmetry with the third line with a normal line of the surface, which is at an intersection point (for example, a point PB3) of the third straight line and the surface of the one lens as the axis of symmetry, a light emitting region in the light emitting layer is positioned on the opposite side to an optical axis of the one lens when viewed from an intersection point (for example, an intersection point PB4) of the fourth straight line and a surface of a second electrode layer which covers the light emitting layer. According to the aspect described above, it is possible to reduce the possibility of light which is emitted from the light emitting layer and reflected by the surface of each of the lenses passing through the second opening section and reaching the light receiving elements.

The imaging apparatus according to each of the aspects described above is preferably used in various types of electronic equipment. Specific examples of the electronic equipment include a biometric authentication apparatus which executes biometric authentication using an image of veins which has been imaged by the imaging apparatus and a biometric information estimating apparatus which estimates biometric information for blood alcohol concentration or the like from images which have been imaged by the imaging apparatus.

What is claimed is:

1. An imaging apparatus comprising:
   a plurality of lenses;
   a light emitting element layer;
   an optically transmissive first substrate; and
   a light receiving element,
   the light emitting element layer being disposed between the lenses and the optically transmissive first substrate, and
   the optically transmissive first substrate being disposed between the light emitting element layer and the light receiving element.

2. The imaging apparatus according to claim 1, wherein the light emitting element layer includes a light emitting layer and a first electrode layer,
   the first electrode layer being disposed between the light emitting layer and the optically transmissive first substrate in a region where the light emitting layer emits light.

3. The imaging apparatus according to claim 1, wherein the light emitting element layer faces the lenses,
   the optically transmissive first substrate includes a first surface on which the light emitting element layer is disposed, and
   the light receiving element is arranged on an opposite side of the light emitting element layer with respect to the first substrate.

4. The imaging apparatus according to claim 2, wherein the first electrode layer is an opening regulating layer with a light blocking property which has a first opening section through which light, which has passed the lenses, passes toward the light receiving element.

5. The imaging apparatus according to claim 3, wherein the light emitting element layer includes a light emitting layer disposed on the first surface and a first electrode layer disposed on the first surface.

* * * * *